US011211938B2

(12) United States Patent
Mallinson

(10) Patent No.: US 11,211,938 B2
(45) Date of Patent: Dec. 28, 2021

(54) METHOD AND APPARATUS FOR GENERATING OUTPUT FREQUENCY LOCKED TO INPUT FREQUENCY

(71) Applicant: ESS Technology, Inc., San Jose, CA (US)

(72) Inventor: A. Martin Mallinson, Kelowna (CA)

(73) Assignee: ESS Technology, Inc., Milpitas, CA (US)

( * ) Notice: Subject to any disclaimer, the term of this patent is extended or adjusted under 35 U.S.C. 154(b) by 0 days.

(21) Appl. No.: 17/241,775

(22) Filed: Apr. 27, 2021

(65) Prior Publication Data

US 2021/0336625 A1    Oct. 28, 2021

Related U.S. Application Data

(60) Provisional application No. 63/016,008, filed on Apr. 27, 2020.

(51) Int. Cl.
*H03L 7/099* (2006.01)
*H03L 7/091* (2006.01)

(52) U.S. Cl.
CPC ............ *H03L 7/0992* (2013.01); *H03L 7/091* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 6,633,184 | B2* | 10/2003 | Idei | H03D 13/004 |
| | | | | 327/12 |
| 7,415,092 | B2* | 8/2008 | Itri | H04L 7/0091 |
| | | | | 327/156 |
| 10,511,311 | B1* | 12/2019 | Tertinek | H03L 7/10 |
| 2002/0097825 | A1* | 7/2002 | Kawahara | H03L 7/0898 |
| | | | | 375/376 |
| 2004/0062336 | A1* | 4/2004 | Kuwata | H03L 7/091 |
| | | | | 375/376 |
| 2004/0183601 | A1* | 9/2004 | Zhang | H03C 3/0925 |
| | | | | 331/16 |
| 2008/0072025 | A1* | 3/2008 | Staszewski | G06F 9/30032 |
| | | | | 712/241 |
| 2015/0188547 | A1* | 7/2015 | Lu | H03L 7/0992 |
| | | | | 327/159 |
| 2018/0145692 | A1* | 5/2018 | Doare | H03C 3/0966 |
| 2019/0056698 | A1* | 2/2019 | Testi | H03L 7/0997 |
| 2019/0334533 | A1* | 10/2019 | Nassar | H03L 7/091 |

* cited by examiner

*Primary Examiner* — Adam D Houston
(74) *Attorney, Agent, or Firm* — Gard & Kaslow LLP

(57) ABSTRACT

A digitally controlled oscillator (DCO) that generates an output frequency clock signal without drift and can be rapidly locked to an input or reference clock is described. A variable-modulus-fixed-increment form of DCO is configured to divide the frequency of a nominally fixed frequency oscillator. A constant is derived from the ratio of a fixed increment to the desired output frequency; this constant is multiplied by the frequency of the oscillator and the modulus adjusted to keep the ratio of the input clock and the output clock constant. The frequency of the oscillator is conveniently measured by counting the number of cycles between input cycles of a reference frequency. The oscillator must be greater in frequency than the expected output and is most accurate in cases where the reference frequency is low compared to the expected output frequency.

6 Claims, 5 Drawing Sheets

METHOD AND APPARATUS FOR GENERATING OUTPUT FREQUENCY LOCKED TO INPUT FREQUENCY

This application claims priority from Provisional Application No. 63/016,008, filed Apr. 27, 2020, which is incorporated by reference herein in its entirety.

FIELD OF THE INVENTION

The present invention relates generally to electronic devices, and more particularly to devices in which a relatively high frequency clock is to be locked to a clock of low frequency.

BACKGROUND OF THE INVENTION

In certain electronic devices, it is useful to lock a clock having a relatively high frequency to a reference clock of a significantly lower frequency. One example is a Universal Serial Bus (USB) interface. As is well known in the art, the USB interface (for the 1.0, 1.1 and 2.0 specifications) uses a 12 megahertz (MHz) data rate at its "full speed," which requires a 48 MHz clock to provide 4 clock cycles per bit to decode the 12 MHz data rate. This clock must be linked to the "Start of Frame" (SOF) pulse that is present in the serial USB data at 1 kilohertz (KHz); the SOF pulse thus may be considered as another clock. In this context, 48 MHz may be thought of as a "high" frequency, and 1 KHz as a "low" frequency.

In some designs of a USB interface, a crystal oscillator of 48 MHz is commonly used; this provides the needed 48 MHz clock, while 48,000 cycles of the oscillator result in one cycle of a 1 KHz signal or clock. However, the crystal oscillator is an expensive component, and a simpler means to replace it would represent a significant saving.

This is not trivially done; because the 48 MHz clock is used to sample the serial data on the USB bus, a reference of precise frequency is required. The USB specification requires that the 48 MHz clock be accurate to about ±20 KHz or about 0.05%.

It is known in the art that locking the clocks together can be achieved by reference to the SOF pulse in the serial data itself; within the USB data stream, the SOF pulse represents an identifiable event that occurs at a predictable and precise rate of 1 KHz. Because the reference from the SOF pulse is at 1 KHz, and the clock to recover the data is typically 48 MHz, the replacement of the 48 MHz crystal requires a frequency-locking loop that can operate with a 48,000:1 ratio of the output frequency to a "reference" frequency of 1 KHz.

In the prior art, means are known to create such a frequency-locking loop that uses the precise 1 KHz rate in the generation of the 48 MHz clock signal. One traditional way of making this alternative to a crystal oscillator is with a phase-locked loop (PLL).

FIG. 1 is a diagram of a conventional phase-locked loop 100 used as a frequency-locking loop as is known in the prior art. The USB 1 KHz SOF pulse is applied as a clock input Fi, and the 48 MHz sampling rate clock signal is generated as the output Fo.

From the 48 MHz output clock Fo, an optional divisor in a feedback loop in which the divisor N is 48,000 generates another 1 KHz signal that is compared to the SOF pulse Fi by a phase frequency detector. The output of the phase frequency detector operates at the same 1 KHz rate and drives a charge pump that controls a voltage controlled oscillator (VCO) at the same 1 KHz rate, i.e., every 1 millisecond (ms). A low-pass filter on the output of the charge pump tends to keep the frequency constant by preventing rapid changes in the signal to the VCO.

At least two problems with the solution in FIG. 1 will be evident to those skilled in the art. First, there is potential drift between the input clock Fi and the fed-back divided output clock Fo due to leakage, etc. The phase frequency detector only compares the divided output to the input every 1 ms, during which time 48,000 cycles of the VCO and output clock Fo have occurred. The low-pass filter has to be of a very low frequency to insure that the charge pump does not go off, and thus has only a limited ability to hold the VCO constant to the required degree, as it may drift significantly during the 48,000 cycles of the output clock Fo. This may be somewhat ameliorated by using two VCOs, so that each VCO goes through fewer cycles between the SOF pulses.

Second, the stability of this closed loop controller 100 requires a time constant that is significantly greater than the interval of phase detector updates; upon application of the Fi input at 1 KHz, multiple cycles of the input, perhaps as many as 50 to 100, must elapse before the loop output frequency is locked, resulting in a delay before the USB device can function.

A cheap and simple way to lock a high frequency clock to a low frequency clock while avoiding drift and significant locking time would be useful.

SUMMARY OF THE INVENTION

Described herein is a novel form of a digitally controlled oscillator (DCO) that holds an output frequency without drift and is able to lock an input or reference clock and an output clock together rapidly.

One embodiment describes a method of generating a high clock frequency signal locked to a low clock frequency, comprising: selecting a frequency of a digitally controlled oscillator, the selected oscillator frequency a number of times higher than the high clock frequency; determining a number of bits that is sufficient to represent a ratio of the high clock frequency and the low clock frequency; setting a first constant to be equal to two to a power equal to or greater than the determined number of bits; setting a multiplication constant to be equal to the first constant divided by a ratio of the high clock frequency to the low clock frequency; setting an initial value of a modulus; if a new cycle of the reference clock has occurred, determining how many cycles of the oscillator frequency occur in a period of one cycle of the low clock frequency and calculating a new value of the modulus by multiplying the determined number of cycles of the oscillator clock in the period of one cycle of the low clock by the multiplication constant; summing an output of a flip flop clocked by the oscillator to the first constant; determining whether the sum of the first constant and the output of the flip flop is greater than or equal to, or less than, the value of the modulus; if the sum of the first constant and the output of the flip flop is greater than or equal to the value of the modulus, generating a carry out value which is an output signal at the high clock frequency and providing the amount by which the sum of the first constant and the output of the logic device exceeds the modulus as an input to the flip flop; and if the sum of the first constant and the output of the flip flop is greater than or equal to the value of the modulus, providing the sum of the first constant and the output of the flip flop as an input to the flip flop.

Another embodiment describes a digitally controlled oscillator for generating a high frequency clock signal locked to a low frequency clock signal, comprising: a first adder configured to add a first input and a second input, the first input representing a selected increment; a second adder configured to compare a modulus to the output from the first adder, and to generate a carry out value that is the high clock frequency signal and indicates whether the output of the first adder is greater than or equal to, or less, than the modulus value, and an output that is the difference between the output of the first adder and the modulus value; a plurality of D-type flip flops having D inputs and Q outputs; an oscillator configured to provide a clock signal to the flip flops; and a switch having a first position configured to connect the output of the first adder to the flip flops when the carry out value indicates that the output from the first adder is not greater than the modulus value, and a second position configured to connect the output of the second adder to the flip flops when the carry out value indicates that the output from the first adder is greater than or equal to the modulus value.

DETAILED DESCRIPTION OF THE INVENTION

Described herein is a novel form of a digitally controlled oscillator (DCO) that modifies the mathematics needed such that it requires no division operation and is configurable in simple logic. In the present approach, both the analog PLL and the VCO or DCO of the prior art are replaced with a new configuration that holds the high, output frequency without drift and is able to lock a low frequency input or reference clock and an output clock together rapidly.

The present approach utilizes a variable-modulus-fixed-increment form of DCO configured to divide the frequency of a nominally fixed frequency oscillator. A constant is derived from the ratio of a fixed increment to the desired high output frequency; this constant is multiplied by the frequency of the oscillator. The frequency of the oscillator is conveniently measured by counting the number of cycles between input cycles of a low reference frequency. The oscillator must be greater in frequency than the expected output (the fixed frequency is divided down by the action of the DCO to create the output) and the application of the present approach is most accurate in cases where the reference frequency is very low compared to the expected output frequency and there are a great many cycles of the oscillator within the reference cycle.

While a USB interface as described above is one example of an application that can benefit from the present approach, the described method and apparatus is not limited to such a case. Rather, as will be clear to those skilled in the art, the present approach can be used with many other applications as well that can benefit from the ability to lock a clock of high frequency to a clock of low frequency.

Figure 1:
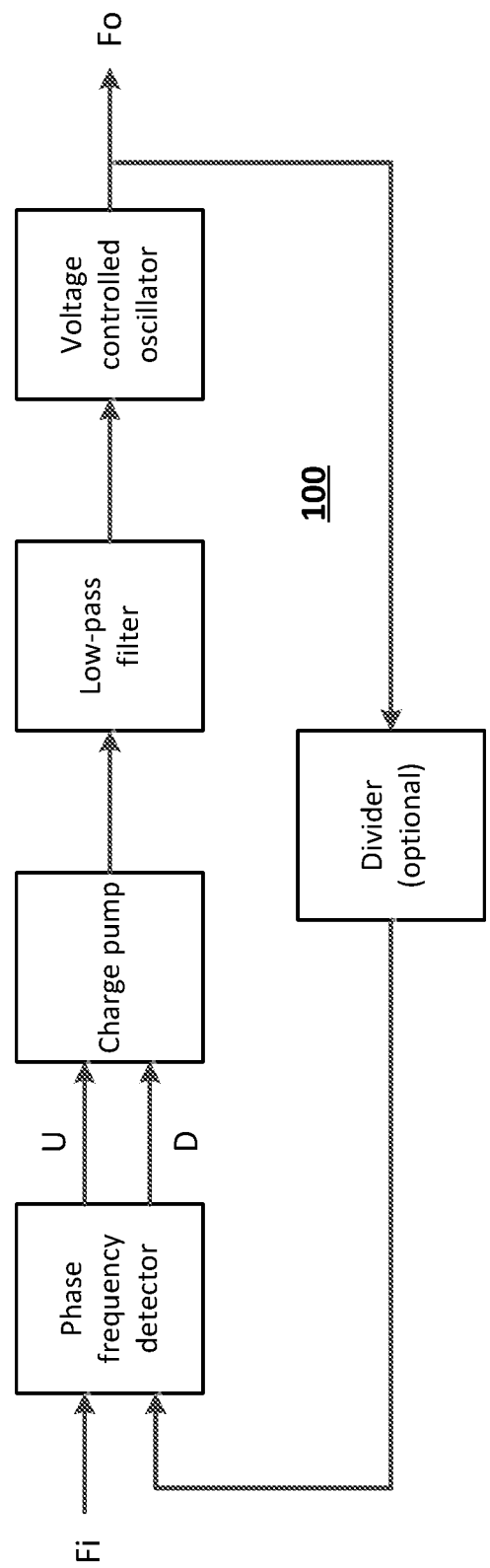
FIG. 1 is a diagram of a phase-locked loop used as a frequency-locking loop as is known in the prior art.

As above, phase-locked loop 100 of FIG. 1 suffers from two problems, first, potential drift between successive input signals, and second, the amount of time required for the output frequency to be locked. In one prior art attempt to solve the first problem, i.e. drift, the phase-locked loop 100 of FIG. 1 is replaced by a DCO having a fixed input clock.

Figure 2:
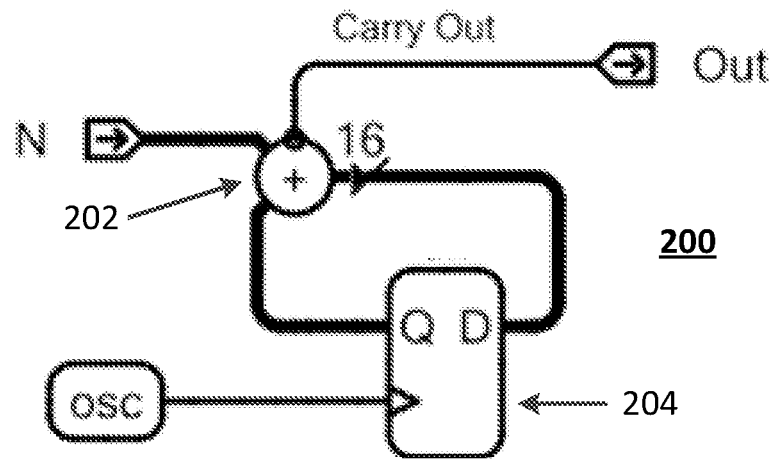
FIG. 2 is a diagram of a circuit using a digitally controlled oscillator as is known in the prior art.

FIG. 2 is a diagram of a circuit 200 using a DCO as known in the prior art. Circuit 200 uses a fixed oscillator OSC, rather than a VCO, that runs at a rate $F_{osc}$ that is significantly higher than the expected output clock frequency $F_{out}$ of 48 MHz in the USB example above. For example, $F_{osc}$ may be a nominal frequency of 200 MHz to 1 gigahertz (GHz).

The input N to circuit 200 is a value on a control input bus that provides a 16-bit quantity in this example. The adder 202 is a conventional digital adder that adds 16-bit values. Each bit of output from adder 202 is fed to an input D of a different one of 16 D-type flip-flops (DFFs) 204. The outputs Q from the DFF's form the second input to the digital adder 202.

The adder has an overflow, or "carry," output that forms the system clock output. No attempt is made to correct for the overflow in the digital adder 202, and consequently the digital calculation is occurring modulo 2^16 in this example. Specifically, any result of the addition greater than 65535 is truncated to 16 bits (effectively by subtraction of 65536) and the carry output is set high.

It is evident that the rate of truncation, and therefore the rate of carry output pulses, is equal to the oscillator rate multiplied by N/65536. More specifically, the output frequency $F_{out}$ is related to the frequency of the oscillator $F_{osc}$ by:

$$F_{out} = F_{osc} \frac{N}{2^K}$$

where K is 16 in this example. An appropriate control loop around this DCO will therefore be able adjust the value of N until the output clock divided by 48,000 is equal to the SOF pulse rate, i.e., the reference clock input.

Figure 3:
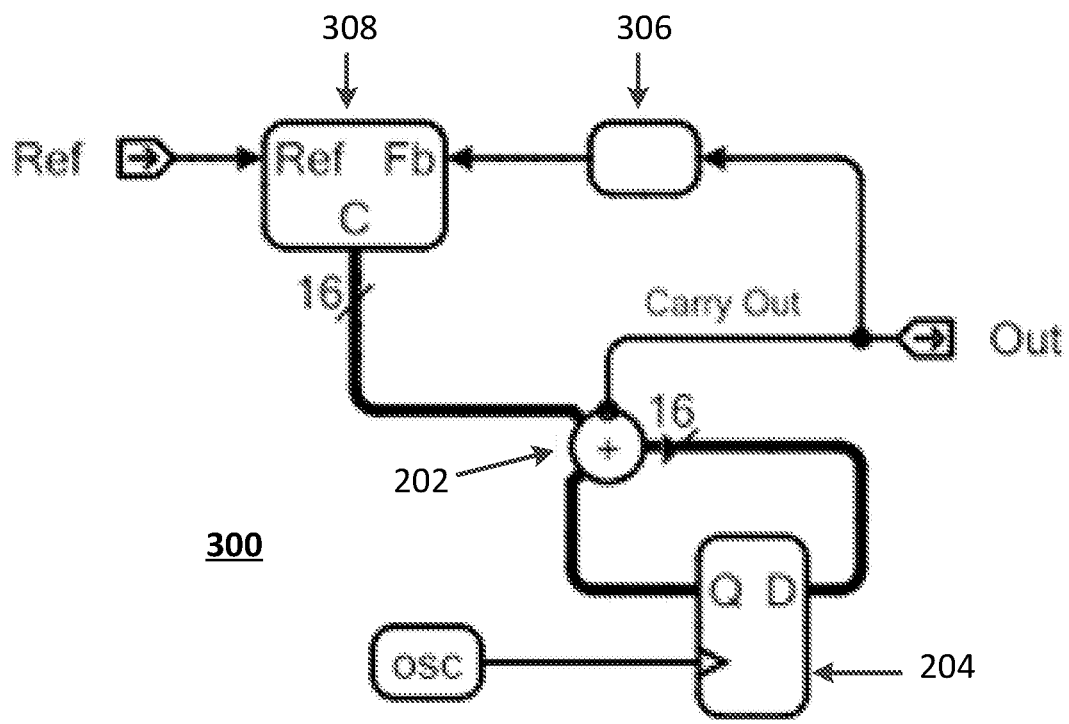
FIG. 3 is a diagram of a circuit using a digitally controlled oscillator with a control loop as is known in the prior art.

FIG. 3 is a diagram of a circuit 300 using a DCO as is also known in the prior art. Circuit 300 is similar that shown in circuit 200 of FIG. 2, with the addition of a control loop that adjusts the value of N to keep the output clock locked to the input clock.

The control loop of circuit 300 includes a divider 306 and a comparator 308. Divider 306 divides the output clock frequency by a number that results in a feedback signal Fb that is expected to be the same as a reference clock frequency REF, which in the USB example is the 1 KHz SOF frequency. Thus, in the USB example, where the output clock frequency $F_{out}$ is 48 MHz and the reference frequency is 1 KHz, divider 306 divides the output frequency by 48,000.

Comparator 308 compares the reference frequency REF to the feedback signal Fb that is expected to have the same frequency, and with a control signal C adjusts the 16-bit value of N up or down to keep the relationship between the reference frequency and the output clock frequency constant, such that $$N = 2^k \frac{F_{out}}{F_{osc}}.$$

In a common and simple application, control signal C that adjusts the value of N may be an up-down counter. If the output Fb of divider 306 in circuit 300 is faster that the reference input REF, the value of N is reduced, and, conversely, if the divided output Fb is slower than REF the value of N is increased.

The advantage of circuit 300 is that the oscillator frequency is fixed; the control loop causes circuit 300 to divide the fixed oscillator frequency by the $$\frac{N}{2^K}$$

factor until the 48 MHz average output frequency is achieved. The oscillator itself is not adjusted and thus its frequency is less subject to drift. Circuit 300 is able to hold the 48 MHz clock accurately between SOF pulses (the signal REF), but as with the PLL 100 of FIG. 1 is not able to lock quickly.

Note that if $F_{osc}$ were to be measured, a sufficiently sophisticated digital controller could calculate N directly, and there would be no need of the up-down counter or control signal C; the value of N could simply be set to the resulting calculation. However, the measurement of $F_{osc}$ requires some time. More importantly, the calculation of N from that measurement requires a division operation. Nevertheless, if a measurement of $F_{osc}$ and the division operation could be accomplished quickly, then the second problem (speed of locking) would also be solved by this configuration.

The prior art approach of circuit 300 of FIG. 3 thus solves the low-pass filter and drift problem, but does not solve the locking time problem, and in the USB example multiple pulses of the 1 KHz SOF signal will still be required to lock the output frequency.

The DCO circuits of the prior art, such as circuits 200 and 300 of FIGS. 2 and 3 described above, implement a modulo arithmetic addition operation. The modulus operation is inherent in the overflowing adder and is fixed at 2K where K is the number of bits in the adder. This type of DCO circuit may be considered as a "fixed-modulus-variable-increment" circuit implementation.

The present approach modifies the DCO known in the prior art to change the mathematics of the direct calculation of N such that it requires a simple multiplication operation, rather than the more complicated division operation, and is thus configurable in simple circuit logic.

Figure 4:
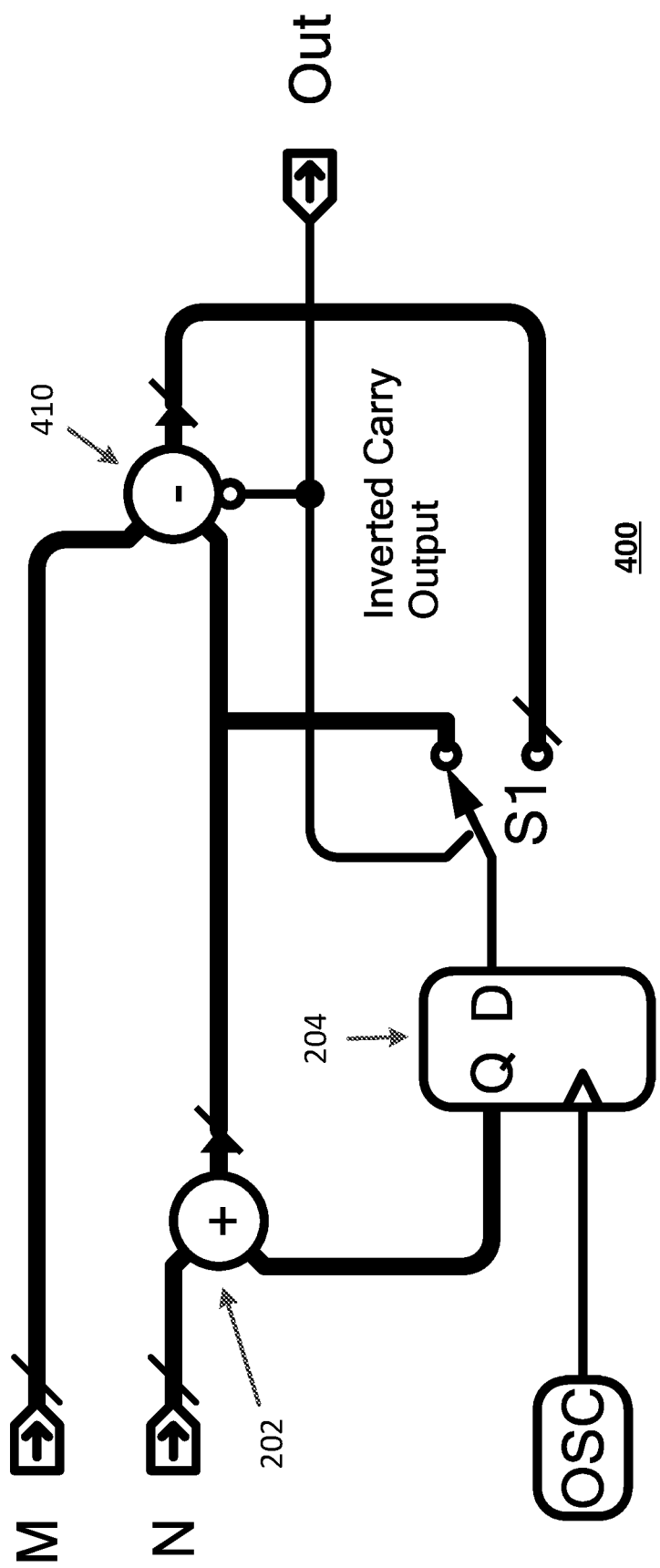
FIG. 4 is a diagram of a circuit 400 configured to generate a high frequency clock signal locked to a low frequency clock according to one embodiment.

FIG. 4 is a diagram of a circuit 400 configured to generate a high frequency clock signal locked to a low frequency clock according to one embodiment of the present approach. Circuit 400 may be thought of as a substitution for circuit 200 of the prior art, allowing for multiplication rather than requiring division of the output clock frequency. Circuit 400 makes explicit the modulo mathematics that are implicit in the bus width in circuits 200 and 300 described above.

Circuit 400 as shown removes the constraint that the modulus be $2^K$. As with circuit 200 of FIG. 2, an input bus provides a value of N, which is fed to an adder 202 along with the Q output of a DFF 204. Also as with circuit 200, an oscillator provides a frequency $F_{osc}$ that controls DFF 204.

An additional input bus provides a value of the variable modulus M. It will be apparent to one of skill in the art that the oscillator frequency must be greater than the output frequency, and thus from the equations below that the value of M must also be greater than the value of N.

A second adder 410 (configured as a subtractor) subtracts the M input from the output of adder 202, i.e., sum of the DFF output and the value of the N input. Adder 410 also provides a value known as Carry Out; normally the value of Carry Out would be low when the output of adder 410 is positive or 0, and high when the output of adder 410 is negative, but in circuit 400 an inverter (the "bubble" on adder 410 where Carry Out is produced) reverses these values. Thus, in circuit 400 the value of Inverted Carry Out is high when the sum from adder 202 exceeds the value of M, and low when the value of M exceeds the sum from adder 202.

On a clock cycle of the oscillator that results in the sum from adder 202 being greater than or equal to the value on the M bus, the high value of Inverted Carry Out from adder 410 causes the output Out to go high, and causes switch S1 to move to a position (opposite of that in FIG. 4) so as to input the "overflow" from adder 410, i.e., the sum from adder 202 minus the value of M to the D input of DFF 204. It is these high values that generate the output signal Out at the output frequency.

On the other hand, when the sum from adder 202 is less than M, then the low value of Inverted Carry Out causes Out to go low, and causes switch S1, in the position shown in FIG. 4, to load the sum from adder 202 into the D input of DFF 204. The descriptive equation of the circuit in FIG. 4 is therefore:

new value dff←(old value dff+N)% M where value dff is the value input to DFF 204 and % is the modulus operator.

Thus, in this instance, M is now functioning as the modulus and the sum from adder 202 is compared to the modulus. Adder 410 provides the value of the sum from adder 202 minus M. The value of Inverted Carry Out indicates whether the result is positive or negative, i.e., whether there is overflow; if it is low, there is no overflow and the sum from of adder 202 goes to the DFF 204, while if it is high, there is an overflow and the sum from adder 202 minus M, which is either positive or zero, goes from adder 410 to DFF 204.

In this configuration of circuit 400, it is possible to fix the value of N and vary the modulus M; this may be considered to be a "fixed-increment-variable-modulus" implementation in contrast to the "fixed-modulus-variable-increment" circuit implementation of circuit 300 of FIG. 3.

In circuit 400 the output frequency $F_{out}$ is related to the oscillator frequency $F_{osc}$ by:

$$F_{out} = F_{osc} \frac{N}{M}$$

Assuming the value of the N is fixed, the explicit calculation of M is now:

$$M = \frac{F_{osc}}{F_{out}} N$$

This differs in a significant way from the known art DCO; the explicit calculation of M is now a constant factor multiple of $F_{osc}$ because $$\frac{N}{F_{out}}$$

is a constant known when the circuit is designed.

The variable modulus M is the value of N times the number of oscillator cycles in a reference cycle; is given an initial value; a reasonable estimate is N times the oscillator frequency $F_{osc}$ divided by the output frequency $F_{out}$. The frequency of the oscillator $F_{osc}$ is measured by counting the number oscillator cycles in a reference cycle, and the value of M is changed with each reference cycle to be the number of oscillator clock cycles in the reference clock cycle times the constant N.

Given this relationship of M and $F_{osc}$, it will be apparent that now the division needed in the prior art, and the associated complex circuitry to accomplish it, is no longer required. Rather, simple multiplication may be used. Multipliers in logic are well known in the art and are considerably easier to implement compared to a divider. A multiplier can be easily constructed using gates without a program-controlled computing machine, and thus without a processor of any kind.

Figure 5:
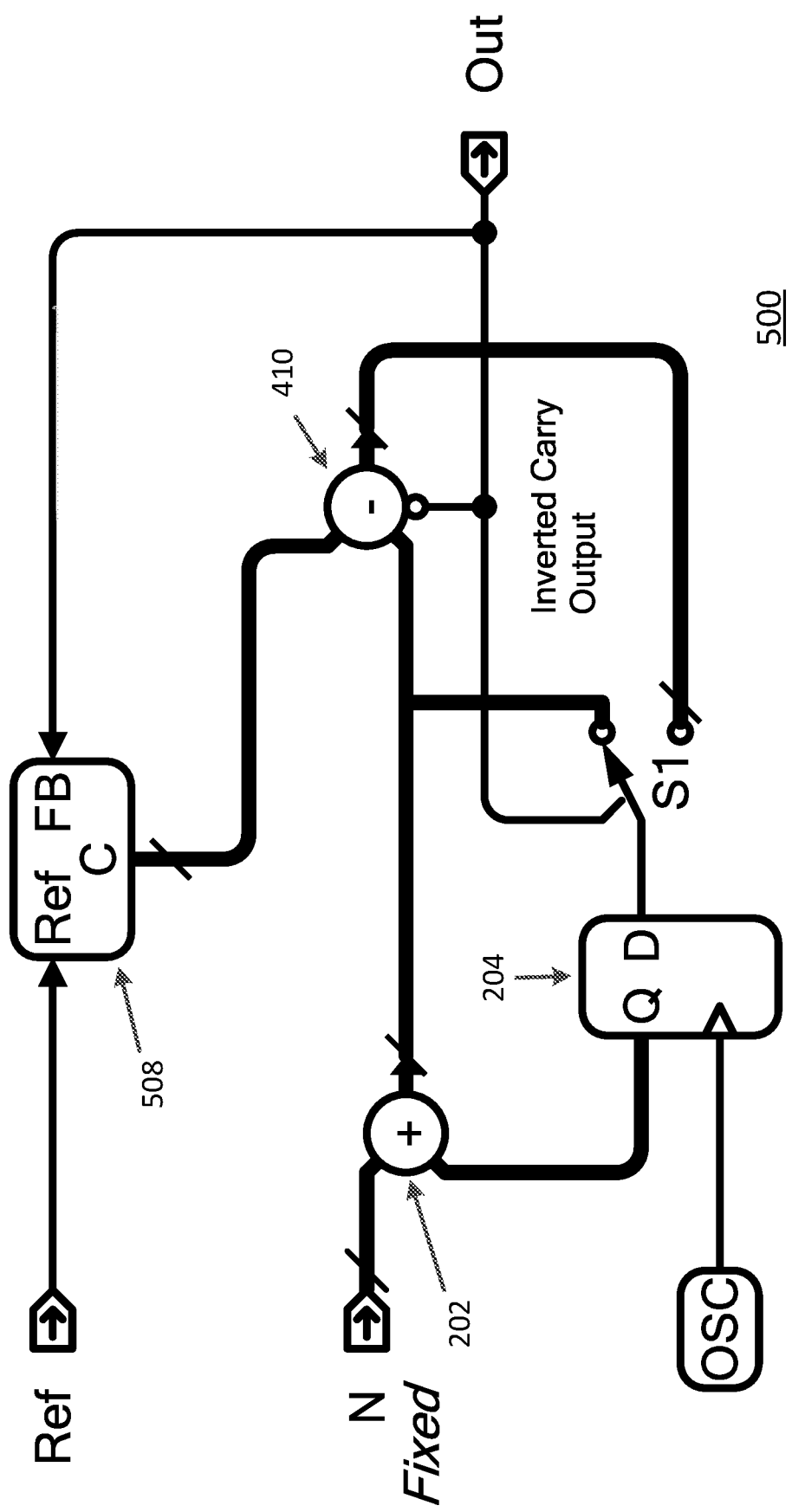
FIG. 5 is a diagram of a circuit 500 configured to generate a high frequency clock signal locked to a low frequency clock according to another embodiment.

FIG. 5 is a diagram of a circuit 500 configured to generate a high frequency clock signal locked to a low frequency clock according to another embodiment. As with circuits 200 and 300 above, circuit 500 is similar to that shown in circuit 400 of FIG. 4, with the addition of a control loop. However, while circuit 300 adjusts the value of N, in the present approach N is fixed, and circuit 500 instead adjusts the value of M that is provided to adder 410. Further, unlike circuit 300, there is no divider in circuit 500.

Instead, the control loop of circuit 500 includes a processor or other logic element 508. Processor 508 determines when a clock cycle of the reference frequency REF has begun, and counts the number of oscillator cycles in one clock cycle of REF to determine the oscillator frequency $F_{osc}$; it then multiplies the oscillator frequency $F_{osc}$ by the multiplication constant to determine a new value of M. A control signal C adjusts the 16-bit value of M up or down to keep the relationship between the reference frequency REF and the output clock frequency constant.

The frequency of the nominal fixed frequency oscillator is conveniently measured by counting the number of cycles between the reference input cycles. The nominally fixed frequency oscillator must be greater in frequency than the expected output (this fixed frequency is divided down by the action of the DCO to create the output) and the application of the present approach is particularly useful in cases where the reference frequency is such a small fraction of the oscillator frequency that the time to lock in the prior art solution requires too many cycles of the output frequency to be practicable. For example, in the USB example, the phase detector of known art PLLs operate at a rate significantly less than the output frequency desired. If the phase detector must execute 50 cycles to converge on the correct control voltage to the VCO, and the ratio of the phase detector rate to the output frequency is 48,000, then 50 times 48,000 cycles will pass before the output frequency can be locked. Since many implementations, such as USB, cannot tolerate more than about 100,000 clock cycles to lock the frequencies, a conventional PLL is nearly 25 times to slow to use.

As above, in the USB example, the reference cycle is that of the Start of Frame (SOF) pulse and has a frequency of 1 KHz. The output required in order to provide 4 clock cycles per bit period to decode a full-speed 12 MHz data rate is 48 MHz. The fixed frequency oscillator must be faster than the expected output; in a typical case the oscillator frequency may be 200 MHz. Consequently, there are 200,000 cycles of the fixed oscillator in the reference cycle. This means that the resolution of the measurement of the fixed oscillator is very high, i.e., 1 part in 200,000, well in excess of the required 0.05% in the USB case.

It will thus be seen that the present approach works by measuring the interval between input reference cycles in terms of the nominally fixed frequency oscillator. Having measured one such interval, a digital multiplier is applied to that interval count to set the variable modulus of the modified DCO.

Hence, the present approach uses an "inverse frequency lock;" it locks the DCO not by measuring the frequency of the incoming reference signal as in the prior art, but rather by measuring the interval of the incoming reference signal, i.e., the inverse of the incoming frequency. This measurement can be performed in one cycle of the input, very much faster than any frequency based locking means of the prior art is able to achieve.

Figure 6:
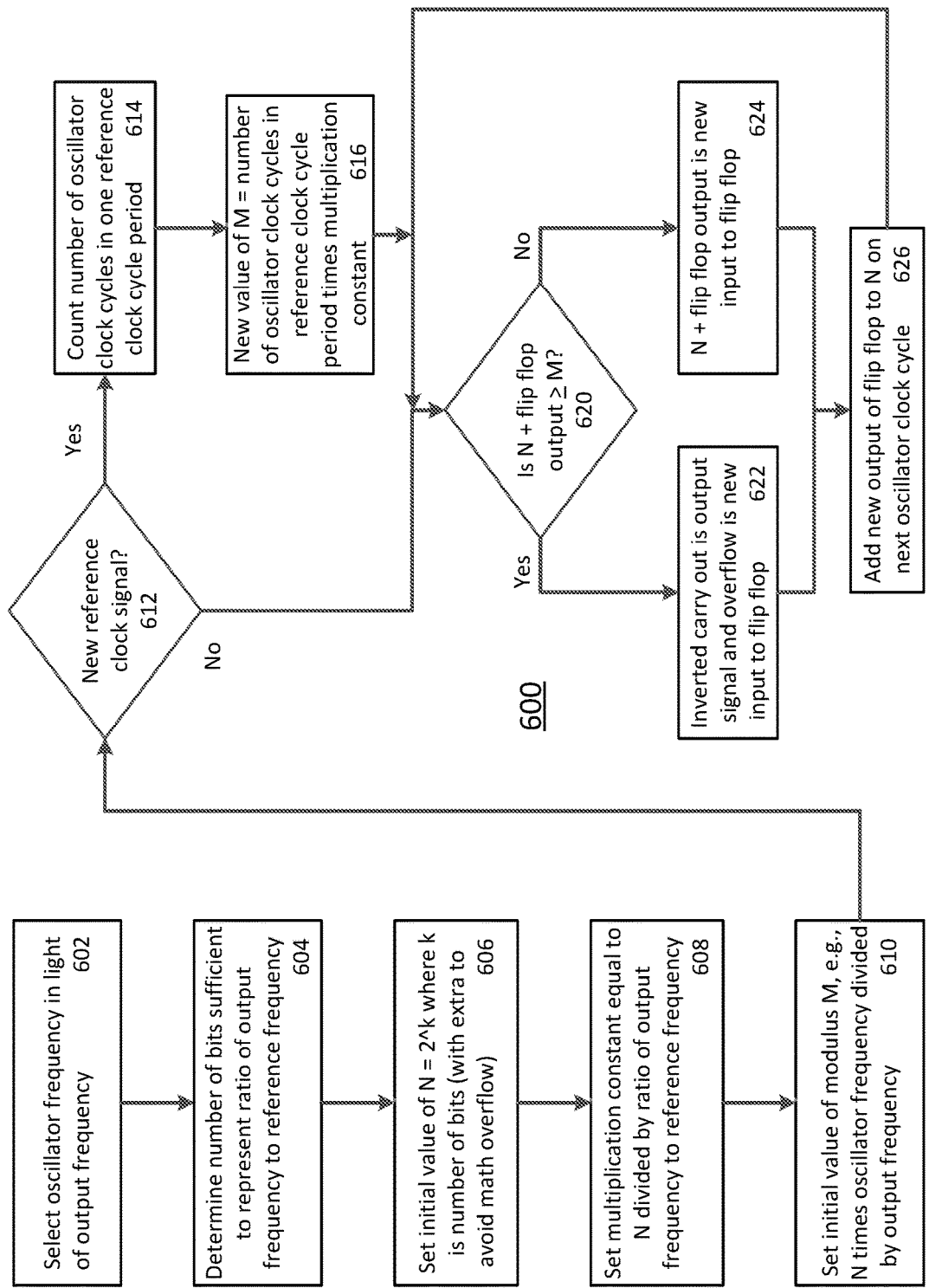
FIG. 6 is a flowchart of a method of generating a locked frequency clock signal with a digitally controlled oscillator according to another embodiment.

FIG. 6 is a flowchart of a method 600 of generating a locked frequency clock signal with a digitally controlled oscillator according to another embodiment of the present approach. The method assumes that the two frequencies that are to be locked in the application, a desired high output frequency signal to be generated and the low reference frequency of the particular application, are known or have previously been determined. For example, in the example of the USB application herein the output frequency is again 48 MHz, while the reference frequency, the SOF signal, is at a frequency of 1 KHz. The method may be performed using logic circuits as described herein, or by a processor or computing device running appropriate code, examples of which are provided below.

At step 602, an oscillator frequency is selected. Selection of the oscillator frequency should be done in light of the output frequency since, as above, the oscillator frequency must be higher than the output frequency, and preferably some number of times higher for better accuracy. In addition, the accuracy the present approach can achieve depends upon the ratio of the oscillator frequency to the reference frequency. For example, the USB specification says the measurement of the oscillator clock must be 0.02% accurate, i.e., 1 part in 5000, and thus the oscillator frequency needs to be at least 5000 times higher than the reference frequency. In the case of the USB application this can be easily met since the ratio of the output frequency to the reference frequency is 48,000 and the oscillator frequency must be greater than the 48 MHz output frequency. A typical oscillator in a USB application might be 200 MHz or as high as 1 GHz. The oscillator frequency may be a user input.

At step 604, a determination is made of the number of bits, i.e., the "bit width," sufficient to represent the ratio of the output frequency to the reference frequency. Next, at step 606, the value of N is set to $2^k$, where k is at least the number of bits determined in step 604, and preferably plus 1 or 2 bits to prevent mathematic overflow in subsequent calculations.

At step 608, the multiplication constant is set to the value of N divided by the ratio of the output frequency to the oscillator frequency.

At step 610, an initial value of the modulus M is set. A reasonable estimate is N times the oscillator frequency $F_{osc}$ divided by the output frequency $F_{out}$.

At step 612, it is determined whether a new reference clock signal has occurred, indicating a new cycle of the reference clock. If so, at step 614 the number of oscillator clock cycles that occur in the period of one cycle of the reference clock is counted, and at step 616 a new value of M is calculated by multiplying the number of oscillator clock cycles in the reference clock cycle period times the multiplication constant. This may be done by logic, such as processor 508 in FIG. 5 above. This monitoring of the reference clock continues throughout the use of the application, and a new value of M is calculated every time a new reference clock signal occurs. In the USB example, step 612 will determine that a new reference clock signal has occurred each time a SOF signal is detected.

Whether there has been a new reference clock cycle, and thus a new calculation of M, or not, at step 620 it is determine whether the value of N plus the output (if any) from a flip flop in the circuit, such as flip flop 204 in the circuits above, is greater than or equal to the value of M. This determination may be made by an adder, such as adder 410 in circuits 400 and 500 of FIGS. 4 and 5 respectively, while the state device is clocked by the oscillator.

If the value of N plus the output of the flip flop is greater than or equal to M, at step 622 a signal indicating such is deemed to be the output signal; in circuits 400 and 500 above, the signal indicating this is the Inverted Carry Out from adder 410. The overflow, i.e., the amount by which N plus the output of the state device exceeds M, is an output from the comparison and is input to the state device.

If the value of N plus the output of the flip flop is less than M, the value of N plus the output of the flip flop becomes the new input to the flip flop.

At step 626, upon the next oscillator clock cycle, the flip flop, such as flip flop 204, produces a new output based upon its current input as determined by either step 622 or step 624. This value is then added to the fixed value of N. In a circuit, this is done by, for example, adder 202 in the figures above.

The method then returns to repeat steps 620 to 626 to again subtract any new value of M from the current value of N plus the logic device output, determine whether there is a new carry out value and overflow and thus output signal, and feed the appropriate value to the flip flop input. This continues as long as desired, for example, as long as a USB device is being used.

It will be apparent to one of skill in the art that certain steps of method 600 occur at different rates. Steps 612 to 616 count the number of cycles of the oscillator clock in each subsequent cycle of the reference clock while the application is in use, and thus occur at the rate of the reference clock; they calculate a new value of M based upon the number of cycles of the oscillator clock in each subsequent cycle of the reference clock. In the USB application, it is expected that the SOF reference clock signal will occur at a rate of 1 KHz. Steps 620 to 626 operate at the much higher rate of the oscillator clock that drives the flip flop; in the USB example this may be 200 MHz to 1 GHz. Thus, as above, a large number of cycles of steps 620 to 626 will occur during one cycle of steps 612 to 616 and between changes in the value of M.

In this way, a DCO using the present approach is able to lock an output frequency to a reference, or input, frequency, within one cycle of the reference clock, using only multiplication rather than division as in the prior art and without drift.

As above, in the present approach is by a constant known when the circuit is designed. In those cases in which the configuration of such a circuit need not change, a logic synthesis tool implementing the multiplier is similarly multiplying by a constant known at elaboration time, i.e., a factor known as a logic equivalent of the high-level description (such as Verilog) is being created at the gate level. A full multiplier is not needed, but rather just that logic necessary to multiply by the known factor.

Appendix 1 is a listing of code showing the present approach as expressed in ANSI standard LISP language. The code illustrates two aspects of the present approach, first, the use of a variable-modulus-fixed-increment form of DCO, and second, multiplication of an interval measurement by a known factor to set the variable modulus.

Appendix 2 is a listing of code in the more widely known Verilog language, while Appendix 3 is a listing of code in the Verilog-A language. It will be apparent to those of skill in the art that the Verilog-A code follows the outline of the Verilog code.

Again, the USB interface described above, and the code addressing such a use case, is only one example of an application that can benefit from the present approach. Those skilled in the art will appreciate that the present approach may be used with many other applications as well that can benefit from the ability to lock a clock of high frequency to a clock of low frequency, and will be able to address other such applications in light of the teachings herein.

By combining these features, it is possible to construct a DCO that avoids the problem of drift and also allows the output frequency to be locked to the input or reference frequency very quickly. One of skill in the art will appreciate that the frequencies used for the reference clock, output clock and oscillator may vary within these principles, and that the values of N and M may be of any desired number of bits that otherwise satisfies the conditions described.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of transistors and the associated feedback loops, resistors, etc., is exemplary; one of skill in the art will be able to select the appropriate number of transistors and related elements that is appropriate for a particular application.

These and other variations upon the embodiments are intended to be covered by the present disclosure, which is limited only by the appended claims.

Appendix 1 -- LISP

This code shows the present approach as expressed in ANSI standard LISP. The code shows two aspects that characterize this invention, first the use of a variable-modulus-fixed-increment form of DCO, and second, multiplication of an interval measurement by a known factor to set the variable modulus.

The arguments to the function #'show-ifl are the nominally fixed oscillator frequency, the input reference frequency, the run time over which to simulate this design and the number of bits in the fixed increment 'N' in the forgoing discussion.

The locally defined function #'sd is the variable-modulus-fixed-increment logic accessing the local state variable 'sds'. Note the function operates by asking if the sum of the state variable and value of the increment 'N' exceeds the modulus as passed into the local function. If it does it sets the state variable to the amount by when that sum exceeds the modulus so returning a non-NULL value.

Note that this LISP codes shows that if 'N' the fixed increment, is chosen to be a power of two, (as this code is doing) the addition of the fixed increment is considerably simplified (most of the sum output is the LSB of the sum input hence no logic is needed).

As the LISP code runs the variable "meas" is counting the number of cycles of the DCO output (the "when (sd mod) .. " line) using the counting variables 'ctr' and 'csnap'. The form "(setq mod (round (* mod (/ meas 48k))))" is adjusting the modulus using the disclosed invention.

```
(defun show-ifl (&key (fop 187M) (input 1k) (run-time 100m) (inc-bits 12))
  (let ((sds 0))
    (flet ((sd
            (mod)
            (when (> (incf sds (ash 1 inc-bits)) mod)
              (decf sds mod))))
      (loop
        with ctr = 0
        with csnap = 0
        with meas = 0
        with mod = 50000
```

```
with inwas = 1e-9
with rg = (random-gauss 0.999999 0 0.005)
for time below run-time by (/ fop)
as in = (+ (funcall rg) (sin (* 2 pi input time)))
as pulse = (and (<= inwas 0) (> in 0))
when (sd mod) do (incf ctr)
when pulse
do
(setq meas (- ctr csnap))
(setq csnap ctr)
(unless (zerop meas) (setq mod (round (* mod (/ meas 48k)))))
and collect meas into y
and collect mod into ym
do (setq inwas in)
finally (plot (list y ym) (/ 1k) "Inverse Frequency Lock")))))
```

Appendix 2 -- Verilog

This example is provided in the more widely known Verilog language. The arguments are: a reset signal to define the state of the machine; a signal at the nominally fixed oscillator frequency, HSClk; the reference signal, REfClk; and an output signal C48k.

The multiplicative factor known at design time is the parameter F in this code. The variable-modulus-fixed-increment is commented in the code, as is the interval calculation. See the comments within the code for details.

```
module InverseFrequencyLock (Reset, HSClk, RefClk, C48k);

// Generally, the accuracy of the created clock needs to be 0.25%. or
    // one part in 400. I arbitrarily choose to make the fixed increment
    // to the DCO to be 10 bits - this is more than sufficient since the
    // variable modulus is greater than this. We can calculate the width
    // of the DCO needed by 10bits * FHSClkmax / 48Mhz. I will assume
    // FHSCLKmax is 500Mhz, so we need at most 4 more bits.
    // The count of the dco needs to be 48,000 in the 1mS interval, so we
    // need at least 16 bits in the counter.

parameter DWIDTH = 14;       // Width of DCO path
    parameter CWIDTH = 16;       // Wdith of counter path
    parameter N  = 1024;         // The fixed increment parameter M  = 3100;         // The initial value of M should be set
                                 //   to the N value times the expected
                                 //   HSClk divided by the expected
                                 //   output. which is 48M. So in the case
                                 //   of N = 1024 we have 1024 * 150M/48M
                                 //   lets say 3100. Close enough! [It
                                 //   does not really matter as long as it
                                 //   is not zero]
    // The factor 1/48k is replaced by a constant as here. This is the
    // rounded value of 2^32/48k. Note that this needs to be the length
    // 2*CWIDTH as above
    parameter F = 32'sd89478;

localparam MI = DWIDTH - 1;
    localparam MC = CWIDTH - 1;

input Reset,   // High to reset all state, registered into the HSClk
                   //   (this is needed do ensure it goes away
                   //   synchronously)
          HSClk,   // High Speed clock from free running oscillator
```

```
         RefClk;  // Reference clock, expected to be 1khz. Must be
present
                 //   for at least one HSClk cycle
   output reg C48k;  // The generated output clock. It will have 48k
edges
                    //   in the RefClk interval
   reg [2:0] rpipe;    // Pipe line to sample Reset
   reg [2:0] pipe;     // Pipeline to sample the RefClk
   reg [1:0] refh;     // RefClk sampled into HSClk domain
   reg signed [MI:0] dco, m;  // DCO state variable and the variable
modulus
   reg signed [MC:0] ctr, clast, count; // Counter and last counter,
count is
                              //  the difference.

// Manage the Reset. If it is high, go high, but don't go low until
   // the pipe has emptied. This is to make sure it goes away
   // synchronously and allows all states controlled by the HSClk to
   // start cleanly (frankly, I am not sure this is needed in this
case,
   // but I am doing it anyhow)
   wire ResetS = Reset || rpipe[2]; // Synchronously removed Reset
   always @(posedge HSClk)  rpipe <= {rpipe[1:0],Reset};

// Register RefClk into HSClk:
   always @(posedge HSClk)
     if (ResetS)
       begin
          pipe <= 0;
          refh <= 0;
       end
     else
       begin
          pipe <= {pipe[1:0],RefClk};
          refh <= {refh[0],pipe[1] && !pipe[2]};
       end // Variable modulus fixed increment DCO
   wire [MI:0] nxt0, nxt1; // Next in bounds, next overflow
   wire        dcoo;       // Carry out of modulus comparison assign nxt0        = dco + N;
   assign {dcoo, nxt1} = dco - m;

always @(posedge HSClk)
     if (ResetS)
       begin
          dco  <= 0;
          C48k <= 0;
       end
     else
       begin
          dco  <= dcoo ? nxt0 : nxt1;
          C48k <= dcoo;
       end // Count the pulses
```

```verilog
   always @(posedge HSClk)
     if (ResetS)
       begin
          ctr   <= 0;
          clast <= 0;
          count <= 0;
       end
     else
       begin
          if (C48k)  ctr <= ctr + 1;
          if (refh[0])
            begin
               clast <= ctr;
               count <= ctr - clast;
            end
       end // else: !if(Reset)

// Now the key part: how to set the precise value of the modulus m
   // every cycle of the RefClk. The key is the factor 1/48k that is
   // approximated here to the parameter F
   wire signed [2*MC+1:0] prod0 = m * count;
   wire signed [MC:0]     prod1 = prod0 >>> (MC+1);
   wire signed [3*MC+2:0] prod2 = prod1 * F;         // F is width 2MC...
   wire signed [MC:0]     prod3 = prod2 >>> (2*MC+2);

always @(posedge HSClk)
     if (ResetS)
       begin
          m <= M;
       end
     else if (refh[1])  // One clock cycle after the RefClk (just to
                        //  give a little more time to the count etc)
       begin
          m <= prod3;
       end endmodule // InverseFrequencyLock
```

Appendix 3 – Verilog-A

An example is provided in the Verilog-A programming language. It will be apparent that this follows the outline of the Verilog shown above.

```
`include "discipline.h"
`include "constants.h"

module INVFREQLOCK (C48K, HSCLK, REFCLK);
//
// Schematic source: ESSPLL:USB48K;InvFreqLock.sch
// (file: c:\ESSPLL\USB48K\InvFreqLock.sch)

parameter K     = 48000; // Multiplier of RefClk
    parameter N     = 4096;  // The fixed increment
    parameter MINIT = 10000; // Initial M value
    parameter VOH   = 1.2;   // Output high level parameter F48K  = 1.0/K; // 1/K for multiplier...
    parameter VTH   = VOH * 0.5;

input HSCLK, REFCLK;
    output C48K;

electrical C48K, HSCLK, REFCLK;

integer m, dco, ctr, clast, count, r0, r1, r2, c48i;

analog
      begin
        @(initial_step)
          begin
            m     = MINIT;
            dco   = 0;
            ctr   = 0;
            clast = 0;
            count = 0;
            r0    = 0;
            r1    = 0;
            r2    = 0;
            c48i  = 0;
          end
      @(cross(V(HSCLK) - VTH, +1))  // Pos edge of the free-running clock
          begin
            // First run the sd modulator:
            c48i = (dco >= m) ? 1 : 0;
            dco  = dco + N;
            dco  = c48i ? (dco - m) : dco;
            ctr  = c48i ? ctr + 1 : ctr;
            // When there is a RefClk edge get the count:
            if ((r0 == 1) && (r1 == 0))
              begin
                count = ctr - clast;
```

```
        clast = ctr;
      end
    // I delayed the Verilog-D (not sure I needed to - but I will
    // replicate it here)
    if ((r1 == 1) && (r2 == 0) && (m != 0) && (count != 0))
      begin
        m = floor((m * count * F48K) + 0.5);
      end
    // Load the RefClk pipeline (to look for edge)
    r2  = r1;
    r1  = r0;
    r0  = (V(REFCLK) > VTH) ? 1 : 0;
   end // @(cross(V(HSCLK) - VTH, +1))

V(C48K) <+ transition(c48i ? VOH : 0.0, 100p, 120p, 120p, 100p);
  end
endmodule // INVFREQLOCK
```

What is claimed is:

1. A method of generating a high clock frequency signal locked to a low clock frequency, comprising:

selecting a frequency of a digitally controlled oscillator, the selected oscillator frequency a number of times higher than the high clock frequency;

determining a number of bits that is sufficient to represent a ratio of the high clock frequency and the low clock frequency;

setting a first constant to be equal to two to a power equal to or greater than the determined number of bits;

setting a multiplication constant to be equal to the first constant divided by a ratio of the high clock frequency to the low clock frequency;

setting an initial value of a modulus;

if a new cycle of the reference clock has occurred, determining how many cycles of the oscillator frequency occur in a period of one cycle of the low clock frequency and calculating a new value of the modulus by multiplying the determined number of cycles of the oscillator clock in the period of one cycle of the low clock by the multiplication constant;

summing an output of a flip flop clocked by the oscillator to the first constant;

determining whether the sum of the first constant and the output of the flip flop is greater than or equal to, or less than, the value of the modulus;

if the sum of the first constant and the output of the flip flop is greater than or equal to the value of the modulus, generating a carry out value which is an output signal at the high clock frequency and providing the amount by which the sum of the first constant and the output of the logic device exceeds the modulus as an input to the flip flop; and if the sum of the first constant and the output of the flip flop is greater than or equal to the value of the modulus, providing the sum of the first constant and the output of the flip flop as an input to the flip flop.

2. The method of claim 1 wherein the initial value of the modulus is the multiplication constant times the oscillator frequency divided by the high frequency.

3. The method of claim 1 further comprising:

determining how many cycles of the oscillator clock occur in a subsequent period of one cycle of the low clock; and calculating a further new value of the modulus by multiplying the determined number of cycles of the oscillator clock in the subsequent period of one cycle of the low clock by the multiplication constant.

4. The method of claim 1 further comprising repeating the steps of:

summing the output of the flip flop to the first constant;

determining whether the sum of the first constant and the output of the flip flop is greater than or equal to, or less than, the value of the modulus;

if the sum of the first constant and the output of the flip flop is greater than or equal to the value of the modulus, generating the carry out value which is the output signal at the high clock frequency and providing the amount by which the sum of the first constant and the output of the logic device exceeds the modulus as an input to the flip flop;

if the sum of the first constant and the output of the flip flop is greater than or equal to the value of the modulus, providing the sum of the first constant and the output of the flip flop as an input to the flip flop.

5. A digitally controlled oscillator for generating a high frequency clock signal locked to a low frequency clock signal, comprising:

a first adder configured to add a first input and a second input, the first input representing a selected increment;

a second adder configured to compare a modulus to the output from the first adder, and to generate a carry out value that is the high clock frequency signal and indicates whether the output of the first adder is greater than or equal to, or less, than the modulus value, and an output that is the difference between the output of the first adder and the modulus value;

a plurality of D-type flip flops having D inputs and Q outputs;

an oscillator configured to provide a clock signal to the flip flops; and a switch having a first position configured to connect the output of the first adder to the flip flops when the carry out value indicates that the output from the first adder is not greater than the modulus value, and a second position configured to connect the output of the second adder to the flip flops when the carry out value indicates that the output from the first adder is greater than or equal to the modulus value.

6. The digitally controlled oscillator of claim 5, further comprising:

a counter configured to count the number of oscillator cycles occurring during one cycle of the low frequency clock and thereby determine the frequency of the oscillator;

a multiplier configured to multiply the oscillator frequency by a constant increment and thereby determine a new value of the modulus.

* * * * *